United States Patent [19]

Kogura et al.

[11] Patent Number: 4,987,673
[45] Date of Patent: Jan. 29, 1991

[54] APPARATUS FOR PACKAGING SEMICONDUCTOR DEVICES

[75] Inventors: Masahisa Kogura; Haruo Yoshida; Minoru Tanaka, all of Fukuoka, Japan

[73] Assignee: Mitsubishi Denki Kabushiki Kaisha, Japan

[21] Appl. No.: 207,623

[22] Filed: Jun. 16, 1988

[30] Foreign Application Priority Data

| Jun. 18, 1987 | [JP] | Japan | 62-151723 |
| Jun. 18, 1987 | [JP] | Japan | 62-151724 |
| Jun. 18, 1987 | [JP] | Japan | 62-171725 |

[51] Int. Cl.⁵ .................... B23P 23/00; F24F 7/00; H05K 13/00; H01L 21/58
[52] U.S. Cl. ......................... 29/564; 29/740; 98/115.3; 437/217
[58] Field of Search ............ 29/33 R, 650, 739, 740, 29/741, 564, 563, 742, 430, 564.2, 564.3; 414/217; 437/217, 219, 220, 906; 228/4.5; 98/115.3, 115.1, 33.1

[56] References Cited

U.S. PATENT DOCUMENTS

| 3,431,637 | 3/1969 | Caracciolo | 437/217 X |
| 3,889,355 | 6/1975 | Aronstein et al. | 29/563 |
| 4,214,364 | 7/1980 | St. Louis et al. | 437/220 X |
| 4,255,169 | 3/1981 | Leliaert et al. | 98/115.1 |
| 4,301,958 | 11/1981 | Hatakenaka et al. | 29/430 |
| 4,441,248 | 4/1984 | Sherman | 437/906 X |
| 4,683,644 | 8/1987 | Tange et al. | 29/740 |
| 4,723,480 | 2/1988 | Yagi et al. | 98/115.3 |
| 4,781,511 | 11/1988 | Harada et al. | 414/217 |
| 4,880,581 | 11/1989 | Dastoli et al. | 98/33.1 |

FOREIGN PATENT DOCUMENTS

| 5222883 | 2/1977 | Japan | 98/115.3 |
| 60-132716 | 7/1985 | Japan |  |
| 61-46967 | 10/1986 | Japan |  |

Primary Examiner—William Briggs
Attorney, Agent, or Firm—Leydig, Voit & Mayer

[57] ABSTRACT

An apparatus for packaging semiconductor devices includes a die bonder, a wire bonder, and a molding unit wherein the die bonder, the wire bonder, and the molding unit are sequentially arranged for operation in an uninterrupted continuous sequence. To prevent semiconductor dies from being contaminated by the dust generated by the molding unit, the die bonder and wire bonder are covered by an air cleaner chamber including an air filter and air ventilator. Alternatively, the molding unit is covered by an air draft chamber including an air supply nozzle and an exhaust pipe which exhausts the dust generated by the molding unit.

7 Claims, 2 Drawing Sheets

APPARATUS FOR PACKAGING SEMICONDUCTOR DEVICES

BACKGROUND OF THE INVENTION

1. Field of the Invention

This invention relates to an apparatus and a method for packaging semiconductor devices and, more particularly, to an apparatus and a method in which die bonding, wire bonding and resin molding operations are sequentially carried out so that the semiconductor dies cut from the wafers are provided with leads and sealed into a resinous package.

2. Description of the Prior Art

In the production of semiconductor devices such as integrated circuits and transistors, semiconductor wafers on which circuits are formed in the previous steps are cut into individual chips or dies, and each die is then provided with leads and a package. In one of the processes for providing semiconductor dies with leads and a package, the following steps are taken. First, the dies are picked up from the cut wafer by a die sorter so that each die is positioned on the precise location for the die in successive patterns formed in lead frames and is bonded thereto. Second, the electrodes on each semiconductor die are coupled to the leads of the patterns formed in the lead frame by means of thin gold or aluminum wires in a wire bonding process. Third, the dies, each of which has been electrically coupled to its respective leads of the lead frame, are molded and sealed into an epoxy or a silicone resin package by transfer molding equipment, together with predetermined portions of the lead frame.

FIG. 1 shows a typical prior art apparatus for performing such packaging of semiconductor dies in a continuous operation. The apparatus comprises a die bonder unit 1, a pair of wire bonders 2a and 2b, a molding unit 3, and a pair of buffers 4a and 4b, which are disposed between the die bonder unit 1 and the pair of wire bonders 2a and 2b, and between the pair of wire bonders 2a and 2b and the molding unit 3, respectively. Except for the portion for transferring the works (i.e., the lead frames on which semiconductor dies have been bonded), the molding unit 3 is partitioned from the rest of the apparatus by a wall 5, which prevents the dust generated in the molding process from contaminating the semiconductor dies during the die bonding and wire bonding processes. The die bonder unit 1, the pair of wire bonders 2a and 2b and the molding unit 3 perform the above-described first, second and third steps, respectively, of the packaging operations of the semiconductor dies. The pair of buffers 4a and 4b, on the other hand, temporarily store in progress the work to adjust for the time lags caused by differences in the times required in the die bonding, the wire bonding and the molding processes, respectively.

The conventional apparatus for providing semiconductor dies with leads and a resinous package as described above is capable of producing a large quantity of a single kind of semiconductor devices with great efficiency. However, the separation of the molding unit by a partition wall from the rest of the apparatus and the disposition of the buffers for the compensation of the time lags in the production line results in a larger size of the apparatus. Thus, the conventional apparatus required a large space and a great cost for the installation thereof, and is uneconomical and unsuitable for the production of small quantities of various types of semiconductor devices.

SUMMARY OF THE INVENTION

Thus, an object of the present invention is to provide an apparatus and a method for equipping semiconductor dies with leads and a resinous package of the above-described type which is small-sized, requires only a small cost for installation, and is efficient in the production of small quantities of various kinds of semiconductor devices.

To achieve the above object, according to one aspect of the present invention, there is provided an apparatus comprising a supporting bench, die bonder means, wire bonder means and molding means, wherein the die bonder and the wire bonder means are disposed on and supported by the supporting bench, the wire bonder means being disposed directly subsequent and adjacent to the die bonder means without the interposition of a buffer therebetween. The molding means, on the other hand, is disposed directly subsequent and adjacent to the wire bonder means without an intervening partition wall or a buffer therebetween. Thus, the die bonder means, the wire bonder means, and the molding means perform their respective steps in an uninterrupted continuous sequence. The die bonder means of the present invention may comprise a die sorter and a die bonder that positions and bonds semiconductor dies to respective predetermined locations on a metallic lead frame. The wire bonder means connects the electrodes formed on each die to the associated leads of the patterns formed in the metallic lead frame. The molding means, on the other hand, may comprise a transfer molding press with a loader and an unloader therefor that molds and seals each semiconductor die into a resinous package together with the predetermined portion of the associated leads of the metallic lead frame.

Preferably, means which prevents the contamination of the semiconductor dies by the dust generated in the molding process is included. Thus, the apparatus according to the present invention may comprise air cleaner means covering both the die bonder and the wire bonder means, or dust dispersion preventing means, i.e., an air draft chamber covering the molding means. The air cleaner means may comprise partitions enclosing the die bonder and wire bonder means, a filter attached to the partitions to form a complete chamber together therewith, and air ventilation means. The air draft chamber, on the other hand, may comprise a partitioning chamber enclosing the molding means, air supplying means directed toward the molding portion of the molding means, and air exhausting means which exhausts the air from the chamber.

According to another aspect of the present invention, in a method for providing semiconductor dies with leads and a resinous package which includes the steps of die bonding a semiconductor element onto a lead frame, wire bonding the semiconductor element with the lead frame, and resin molding the semiconductor element, there is provided the improvement wherein the die bonding step, the wire bonding step and the resin molding step are carried out in a continuous sequence.

According to a further aspect of the present invention, in a method for providing semiconductor dies with leads and a resinous package which includes the steps of die bonding a semiconductor element onto a lead frame, wire bonding the semiconductor element with the lead frame, and resin molding the semiconductor element, there is provided the improvement wherein either of the die bonding step and the wire bonding step or the resin molding step is hermetically sealed from the outside atmosphere and dedusted, and the die bonding step, the wire bonding step and the resin molding step are carried out in a continuous sequence.

BRIEF DESCRIPTION OF THE DRAWINGS

Further features and details of the present invention will become more clear in the following description of the preferred embodiments, taken in conjunction of the attached drawings, in which.

In the drawings, like reference numerals represent like or similar elements or portions of the apparatus.

DETAILED DESCRIPTION OF THE PREFERRED EMBODIMENTS

Figure 1:
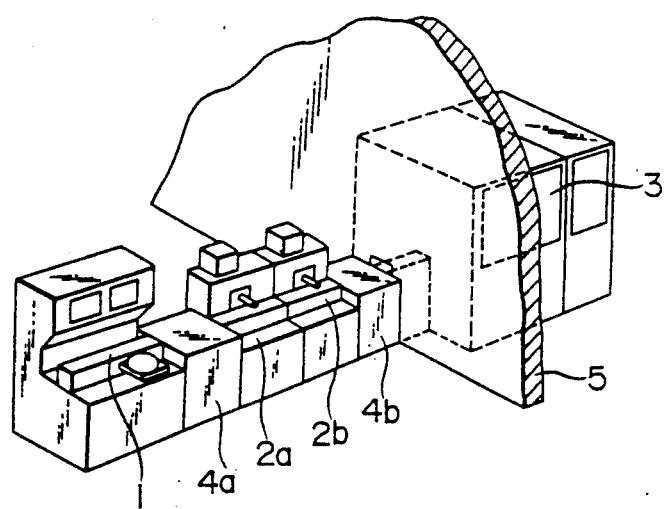
FIG. 1 is a perspective view of a typical prior art apparatus for performing die bonding, wire bonding and molding operations in a continuous sequence.
Figure 2:
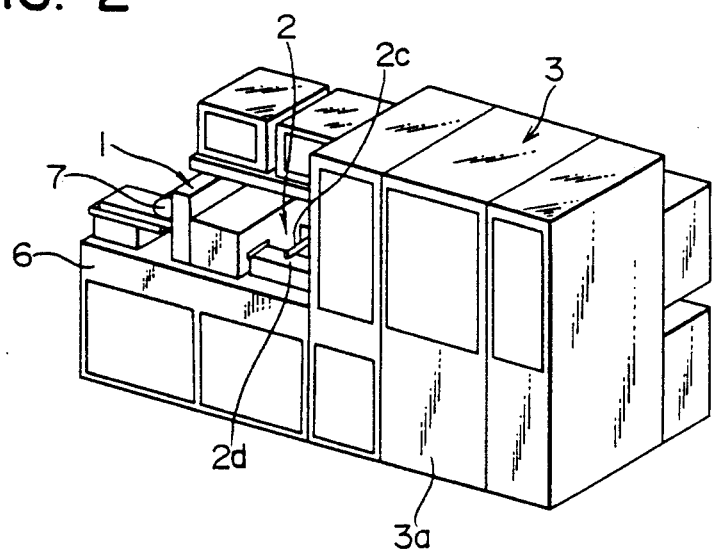
FIG. 2 is a perspective view of an apparatus according to the present invention for performing the same series of operations as the apparatus of FIG. 1 in an uninterrupted continuous sequence, wherein the molding device is covered by an air draft chamber.
Figure 3:
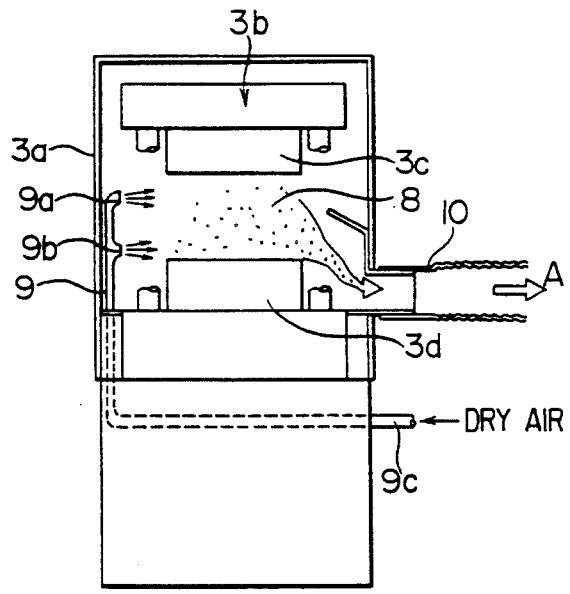
FIG. 3 is a sectional view of the molding device of the apparatus of FIG. 2, showing schematically the flow of air therein.

Referring now to FIGS. 2 and 3 of the drawings, the first embodiment of the present invention is described. The apparatus of FIGS. 2 and 3 comprises a die bonder unit 1 and a wire bonder unit 2 disposed on and supported by a common supporting bench 6, and a molding unit 3 disposed directly adjacent and subsequent to the wire bonder unit 2. Thus, the apparatus performs the die bonding, wire bonding and molding steps successively in an uninterrupted continuous sequence.

The die bonder unit 1 comprises a die sorter which selectively picks up the semiconductor pellets or dies of good quality from the cut wafer 7 and rearranges the selected dies on a tray. Each die is then positioned on and bonded to a predetermined location, i.e., a die pad, of one of the repeating patterns formed on a metallic lead frame (not shown) by a die bonder device of the die bonder unit 1. The die bonder device may, for example, be of a paste bonding type in which the dies are bonded to lead frames by means of an electrically conducting adhesive comprising a thermosetting resin such as epoxy resin and silver or gold powder mixed therein. The die bonder device may, however, be any one of conventional die bonders which are capable of automatic operation.

The wire bonder unit 2 comprises a bonding head 2c having at an end portion thereof a bonding tool 2d, and an X-Y table, and electrically connects the bonding pads, i.e., the electrodes, formed on the dies with associated leads of the pattern of the lead frame on which the die has been positioned, by means of thin bonding wires of gold or aluminum. The wire bonder of the bonder unit 2 may be any conventional wire bonder, but is preferred to be a ball bonding or nail head bonding type in which the wire bonding is effected by means of the thermocompression bonding method utilizing gold wires, because of their high reliability and efficiency in an automatic process.

The molding unit 3 comprises a loader, which automatically loads the work, i.e. the lead frame to which the dies have been bonded, into the transfer molding device and an unloader which automatically unloads the work from the transfer molding device, and is covered by an air draft chamber 3a. As shown schematically in FIG. 3, the transfer molding device 3b comprises upper and lower molding dies 3c and 3d, and molds and seals each semiconductor die together with a predetermined portion of the leads of the associated pattern of the lead frame into a thermosetting resin package made, for example, of an epoxy resin or, a silicone resin. The molding unit 3 may be any conventional transfer molding equipment which is capable of automatic operation. The dust 8 generated in the molding process, especially at the time at which the molding dies 3c and 3d are opened, is exhausted from the chamber 3a by means of an air draft. Namely, a flow of dry air is supplied through a pipe 9c to the orifices 9a and 9b of the nozzle 9 and is directed therefrom toward the space between or around the upper and lower molding dies 3c and 3d. The flow of air thus supplied from the orifices 9a and 9b and passing between or around the molding dies 3c and 3d and carrying the dust therein is exhausted through an exhausting pipe 10 as shown by an arrow A outside of the room in which the apparatus of FIG. 2 is installed. Thus, contamination of the semiconductor dies during the die bonding and wire ponding processes by the dust 8 generated by the molding device 3b is effectively prevented.

Figure 4:
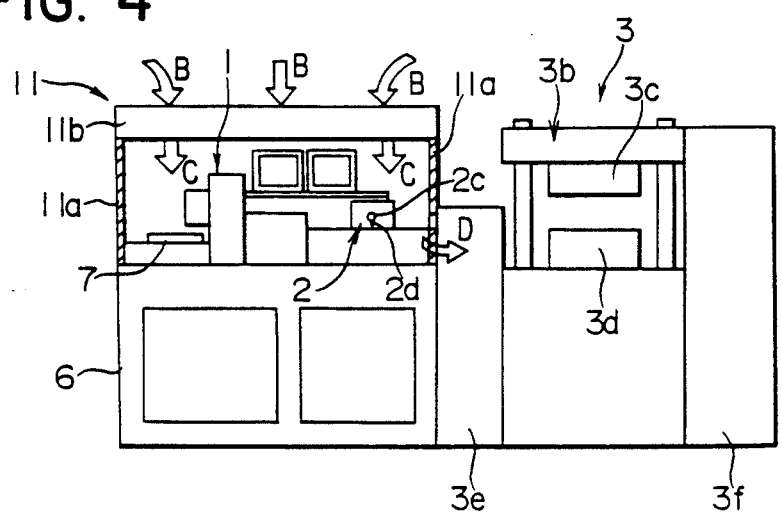
FIG. 4 is a side view of another apparatus according to the present invention, in which the die bonder and the wire bonder units are covered by an air cleaner chamber, the interior of which is illustrated in a cutaway view to show the flow of air therein schematically.

Referring now to FIG. 4 of the drawings, another embodiment of the present invention in which the die bonder and the wire bonder units are covered by an air cleaner chamber is described. The apparatus of FIG. 4 has a construction similar to that of FIGS. 2 and 3 and operates similarly thereto, except that the die bonder and the wire bonder units 1 and 2 are covered by an air cleaner chamber 11 and the molding unit 3, on the other hand, is not covered so that the loader 3e, the molding device 3b and the unloader 3f are outside the air cleaning chamber 11. The air cleaner chamber 11 comprises four side partitions 11a fixed on the upper surface of the supporting bench 6 at the four sides thereof, which surround the die bonder and the wire bonder units 1 and 2 on four sides. An air filter 11b constituting the ceiling of the chamber 11 is fixed on the top ends of the partitions 11a to form a complete chamber therewith. The air filter 11b, which captures and removes the dust from the air flowing therethrough, may comprise a pre-filter, an intermediate air filter and a high efficiency particulate air filter (HEPA filter). The air cleaner chamber also comprises an air ventilation means (not shown), such as an exhausting fan, which causes the outside air to flow through the filter 11b into the chamber, to be led in the chamber 11 over to the die bonder and the wire bonder units 1 and 2 in a vertical laminar flow, and to be exhaused from exhaust openings (not shown) formed at the base of the partitions 11a, as shown schematically by the arrows B, C and D respectively. Thus, the die bonder and the wire bonder units 1 and 2 are kept in a clean air atmosphere from which contaminating dust has been effectively removed.

Although in the above description particular embodiments of the present invention have been described, it should be understood that many modifications may be made without departing from the scope and spirit of the present invention. For example, when the die bonder and wire bonder units are covered by an air cleaner chamber as in the apparatus of FIG. 4, the air filter may form a side wall of the chamber instead of the ceiling thereof, and the air ventilation means may cause a laminar air flow in the horizontal direction.

What is claimed is:

1. An apparatus for attaching leads to and encapsulating semiconductor dies comprising:
   a supporting bench;
   a die bonder for positioning and bonding semiconductor dies to respective predetermined locations on a respective one of a plurality of lead frames, each lead frame having a pattern of leads formed therein, said die bonder being disposed on and supported by said supporting bench;
   a wire bonder for connecting electrodes of a semiconductor die to said leads of the pattern of the respective lead frame with metallic wires, said wire bonder being disposed directly subsequent and adjacent to said die bonder and disposed on and supported by said supporting bench;
   molding means for molding and sealing each of said semiconductor dies with a predetermined portion of the respective lead frame into a resinous package, said molding means being disposed directly subsequent and adjacent to said wire bonder for performance of die bonding, wire bonding, and molding in an uninterrupted continuous sequence; and
   an air cleaner separating said die bonder and wire bonder from said molding means and supplying clean air to said die bonder and wire bonder but not to said molding means.

2. An apparatus for providing attaching leads to and encapsulating semiconductor dies comprising:
   a supporting bench;
   a die bonder for positioning and bonding semiconductor dies to respective predetermined locations on a respective one of a plurality of lead frames, each lead frame having a pattern of leads formed therein, said die bonder being disposed on and supported by said supporting bench;
   a wire bonder for connecting electrodes of a semiconductor die to said leads of the pattern of the respective lead frame with metallic wires, said wire bonder being disposed directly subsequent and adjacent to said die bonder and disposed on and supported by said supporting bench;
   molding means for molding and sealing each of said semiconductor dies with a predetermined portion of said lead frame into a resinous package, said molding means being disposed directly subsequent and adjacent to said wire bonder for performance of die bonding, wire bonding, and molding in an uninterrupted continuous sequence; and
   dust dispersion preventing means enclosing said molding means and separating said molding means from said die bonder and said wire bonder for preventing dust generated during molding from being dispersed to said die bonder and wire bonder.

3. An apparatus as claimed in claim 1 wherein said air cleaner comprises partitioning means defining an interior volume containing said die bonder and wire bonder and an exterior volume outside the interior volume and containing an air filter for removing dust from a flow of air passing through said air cleaner into the interior volume and air ventilation means for causing air to pass through said air filter into the interior volume, over and around said die bonder and wire bonder, and to be exhausted from the interior volume to the exterior volume.

4. An apparatus as claimed in claim 3 wherein said partitioning means comprises side partitions enclosing said die bonder and wire bonder within side walls, and said air filter is disposed on top of said side walls, said air ventilation means causing air to flow through said air cleaner in a vertical laminar flow over said die bonder and wire bonder from above.

5. An apparatus as claimed in claim 2 wherein said dust dispersion preventing means comprises a partitioning chamber enclosing said molding means, air supplying means for supplying a flow of air into said partitioning chamber, and air exhausting means for exhausting air which has passed through said partitioning chamber to remove dust therein generated by said molding means.

6. An apparatus as claimed in claim 5, wherein said air supplying means comprises a nozzle directed toward said molding means.

7. An apparatus as claimed in claim 5, wherein said air supplying means comprises means for supplying dry air.

* * * * *